(12) United States Patent  
Adkisson et al.

(10) Patent No.: US 8,138,531 B2
(45) Date of Patent: Mar. 20, 2012

(54) STRUCTURES, DESIGN STRUCTURES AND METHODS OF FABRICATING GLOBAL SHUTTER PIXEL SENSOR CELLS

(75) Inventors: James William Adkisson, Jericho, VT (US); John Joseph Ellis-Monaghan, Grand Isle, VT (US); Mark David Jaffe, Shelburne, VT (US); Richard John Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 174 days.

(21) Appl. No.: 12/561,581

(22) Filed: Sep. 17, 2009

(65) Prior Publication Data

US 2011/0062542 A1 Mar. 17, 2011

(51) Int. Cl.
*H01L 31/113* (2006.01)

(52) U.S. Cl. ........ 257/291; 257/461; 257/292; 257/290; 257/293; 257/E27.133; 257/E25.032; 438/48

(58) Field of Classification Search ............ 257/461
See application file for complete search history.

(56) References Cited

U.S. PATENT DOCUMENTS

| | | | | |
|---|---|---|---|---|
| 5,859,450 A * | 1/1999 | Clark et al. | ............... | 257/233 |
| 6,462,365 B1 * | 10/2002 | He et al. | ............... | 257/292 |
| 6,566,697 B1 | 5/2003 | Fox et al. | | |
| 6,593,607 B1 * | 7/2003 | Hseih | ............... | 257/292 |
| 6,639,293 B2 | 10/2003 | Furumiya et al. | ............... | 257/462 |
| 6,853,046 B2 * | 2/2005 | Shibayama | ............... | 257/466 |
| 6,921,934 B2 * | 7/2005 | Patrick | ............... | 257/292 |
| 7,071,505 B2 * | 7/2006 | Rhodes | ............... | 257/292 |
| 7,129,979 B1 | 10/2006 | Lee | | |
| 7,180,150 B2 * | 2/2007 | Min | ............... | 257/440 |
| 7,253,461 B2 | 8/2007 | Yang et al. | | |
| 7,312,484 B1 * | 12/2007 | Drowley et al. | ............... | 257/187 |
| 7,385,238 B2 * | 6/2008 | Mouli | ............... | 257/292 |
| 7,402,450 B2 * | 7/2008 | Ezaki et al. | ............... | 438/57 |
| 7,705,381 B2 * | 4/2010 | Shinohara et al. | ............... | 257/292 |
| 7,728,277 B2 * | 6/2010 | Stevens et al. | ............... | 250/214.1 |
| 7,777,259 B2 * | 8/2010 | Kim | ............... | 257/292 |
| 7,808,022 B1 * | 10/2010 | Dierickx | ............... | 257/292 |
| 7,821,046 B2 * | 10/2010 | Brady | ............... | 257/291 |
| 7,821,093 B2 * | 10/2010 | Kitano et al. | ............... | 257/461 |
| 7,897,425 B2 * | 3/2011 | Baek et al. | ............... | 438/57 |
| 7,898,010 B2 * | 3/2011 | Mouli et al. | ............... | 257/292 |
| 7,915,652 B2 * | 3/2011 | Lee et al. | ............... | 257/291 |
| 7,948,048 B2 * | 5/2011 | Kuroda | ............... | 257/461 |
| 7,952,158 B2 * | 5/2011 | Akram | ............... | 257/436 |
| 2004/0201072 A1 * | 10/2004 | Rhodes | ............... | 257/435 |
| 2005/0145902 A1 * | 7/2005 | Mouli | ............... | 257/291 |
| 2005/0230721 A1 * | 10/2005 | Patrick | ............... | 257/292 |
| 2006/0017072 A1 * | 1/2006 | Dosluoglu | ............... | 257/218 |
| 2006/0244020 A1 * | 11/2006 | Lee | ............... | 257/291 |

(Continued)

*Primary Examiner* — Eugene Lee
*Assistant Examiner* — Mohammed Shamsuzzaman
(74) *Attorney, Agent, or Firm* — Schmeiser, Olsen & Watts; Anthony Canale

(57) ABSTRACT

Pixel sensor cells, method of fabricating pixel sensor cells and design structure for pixel sensor cells. The pixel sensor cells including: a photodiode body in a first region of a semiconductor layer; a floating diffusion node in a second region of the semiconductor layer, a third region of the semiconductor layer between and abutting the first and second regions; and dielectric isolation in the semiconductor layer, the dielectric isolation surrounding the first, second and third regions, the dielectric isolation abutting the first, second and third regions and the photodiode body, the dielectric isolation not abutting the floating diffusion node, portions of the second region intervening between the dielectric isolation and the floating diffusion node.

28 Claims, 13 Drawing Sheets

U.S. PATENT DOCUMENTS

| | | |
|---|---|---|
| 2007/0034898 A1* | 2/2007 | Tennant et al. ............... 257/184 |
| 2007/0063303 A1* | 3/2007 | Lim .............................. 257/461 |
| 2007/0102738 A1* | 5/2007 | Adkisson et al. ............. 257/292 |
| 2007/0145438 A1* | 6/2007 | Adkisson et al. ............. 257/290 |
| 2007/0152291 A1* | 7/2007 | Lim .............................. 257/461 |
| 2008/0006857 A1* | 1/2008 | Mouli et al. .................. 257/292 |
| 2008/0150069 A1* | 6/2008 | Popovic et al. ............... 257/443 |
| 2008/0157256 A1* | 7/2008 | Kim .............................. 257/461 |
| 2008/0277701 A1* | 11/2008 | Lee et al. ...................... 257/292 |
| 2009/0026511 A1* | 1/2009 | Brady et al. ................... 257/292 |
| 2009/0166516 A1* | 7/2009 | Tamura et al. ............. 250/214.1 |
| 2009/0256226 A1* | 10/2009 | Tatani et al. .................. 257/432 |
| 2010/0084731 A1* | 4/2010 | Lee .............................. 257/461 |
| 2011/0018094 A1* | 1/2011 | Chapman et al. ............. 257/532 |

* cited by examiner

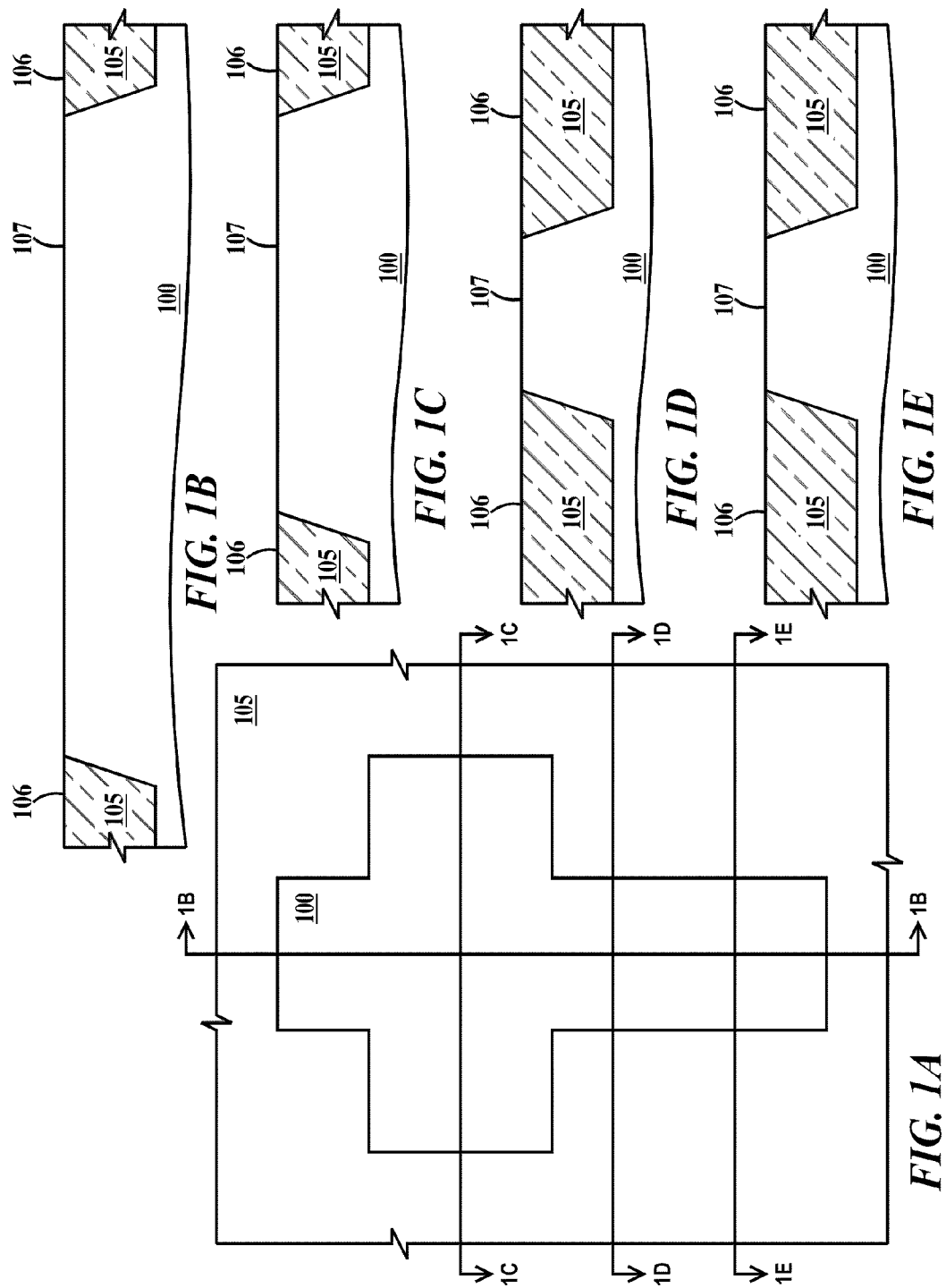

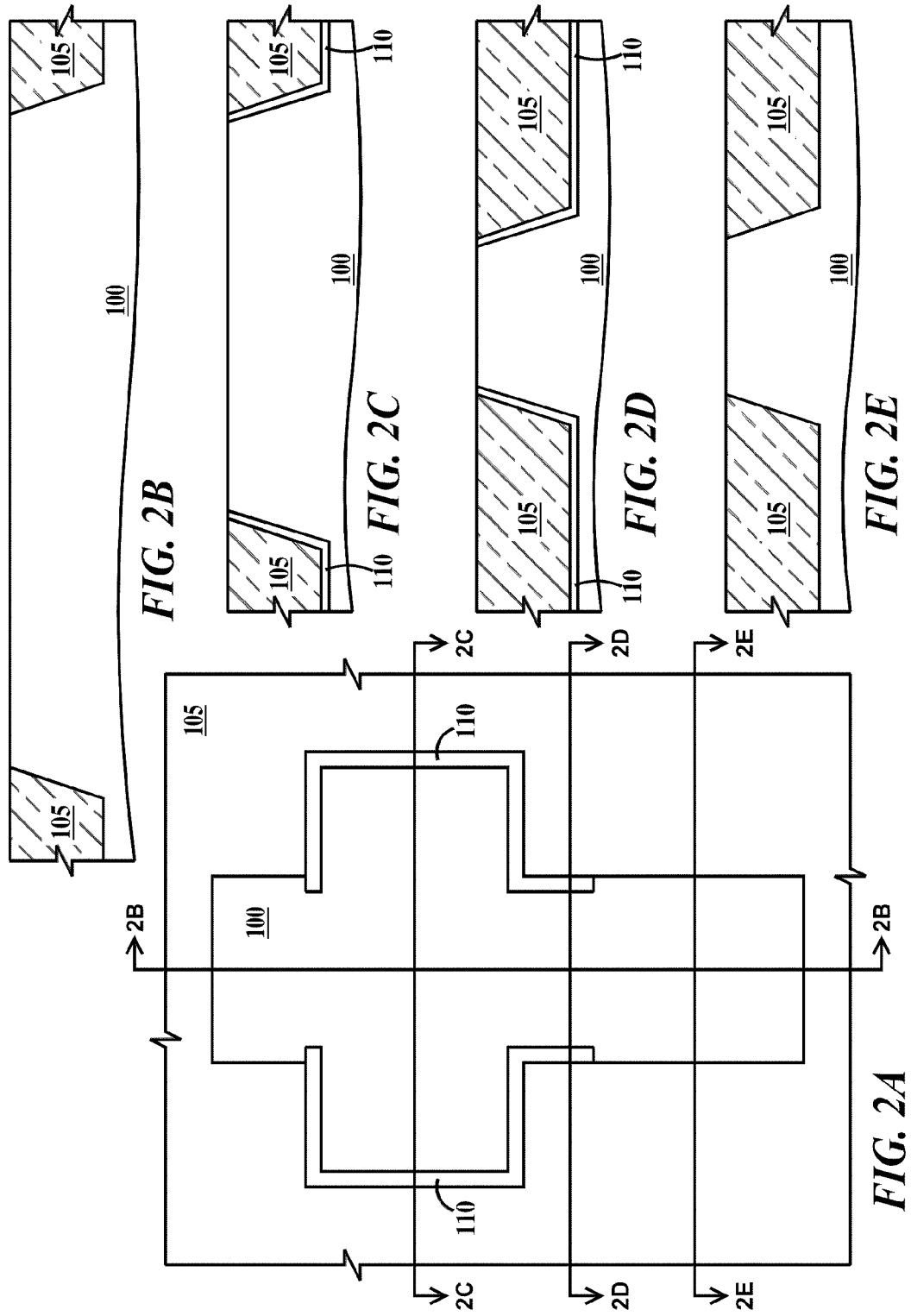

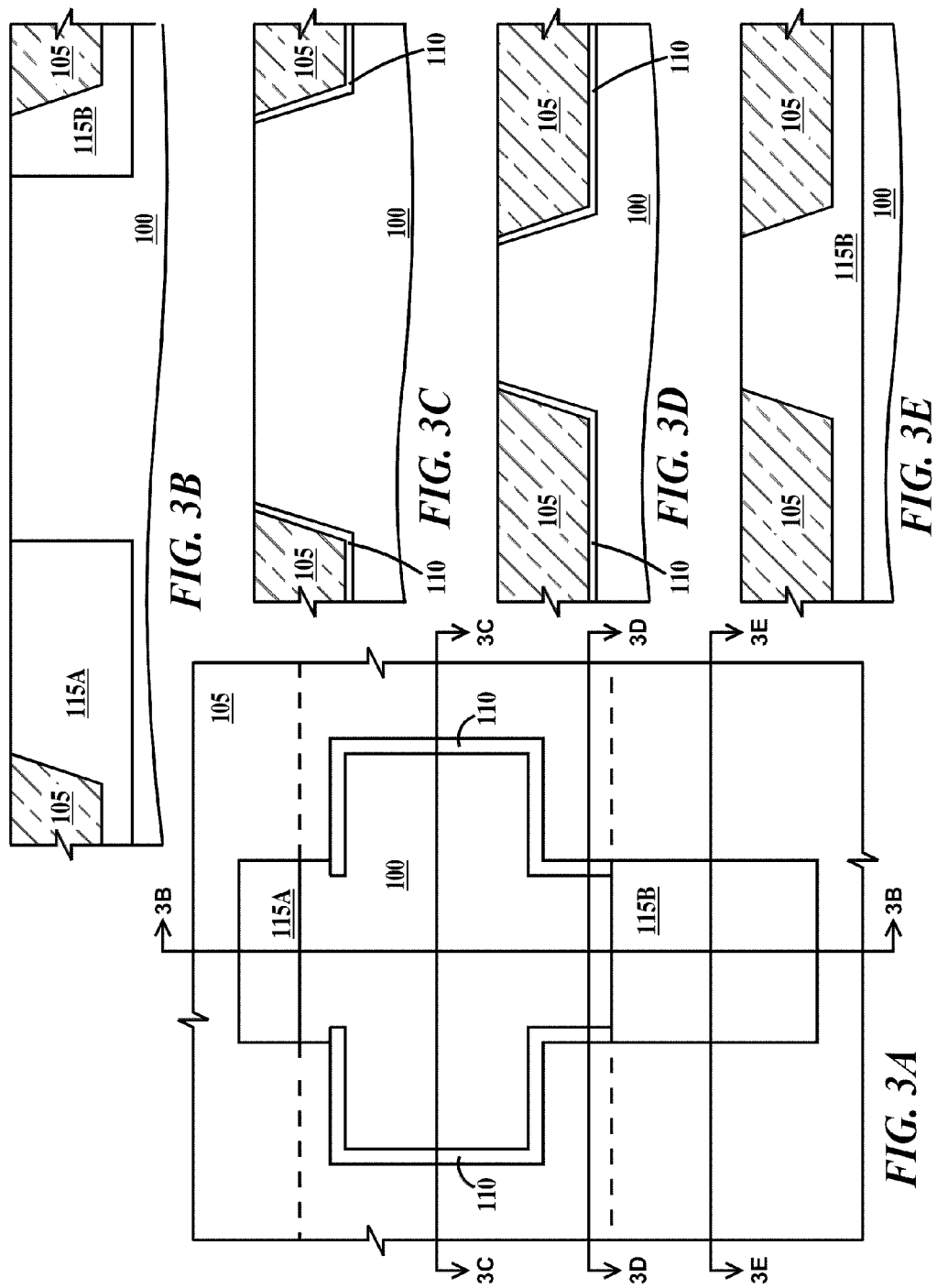

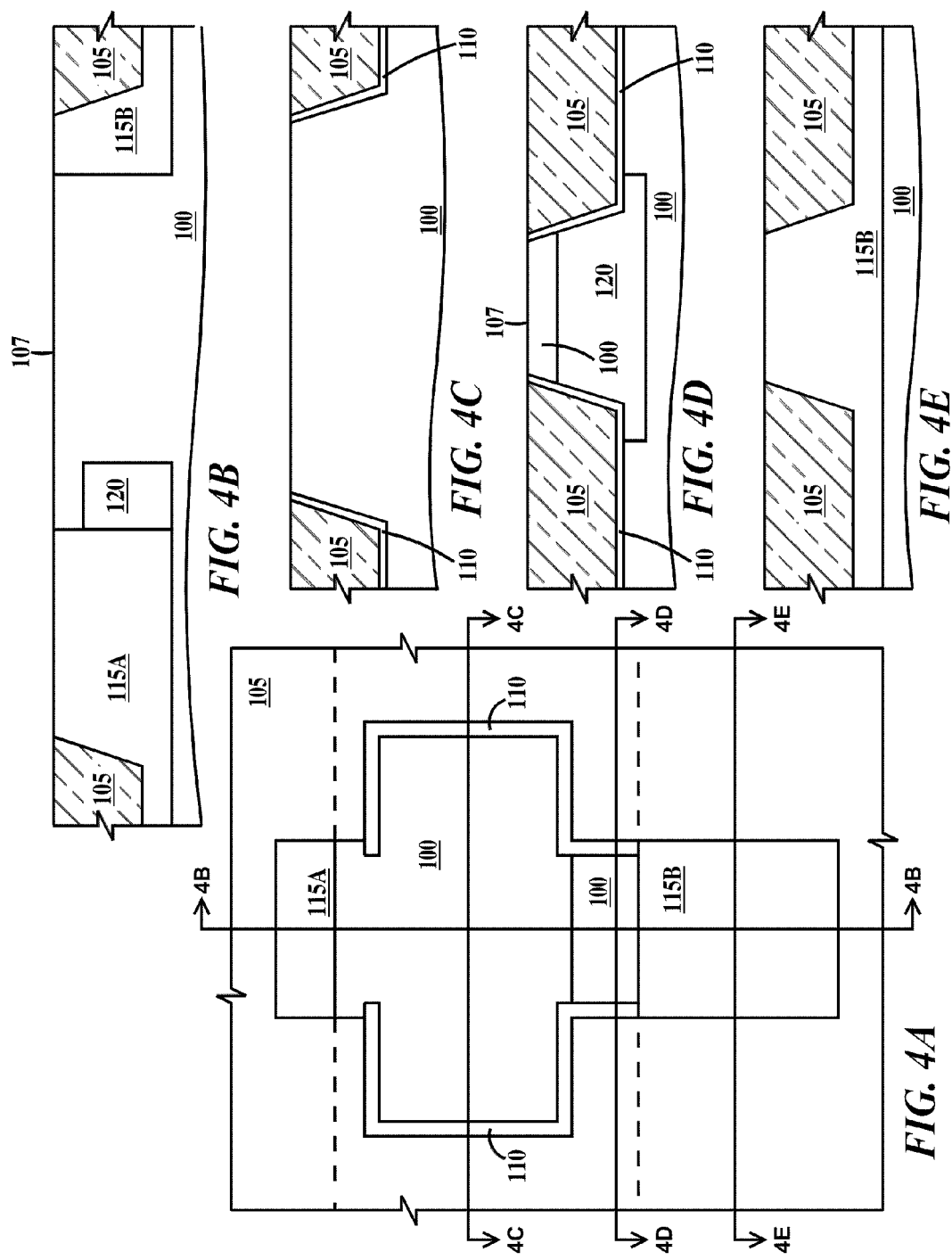

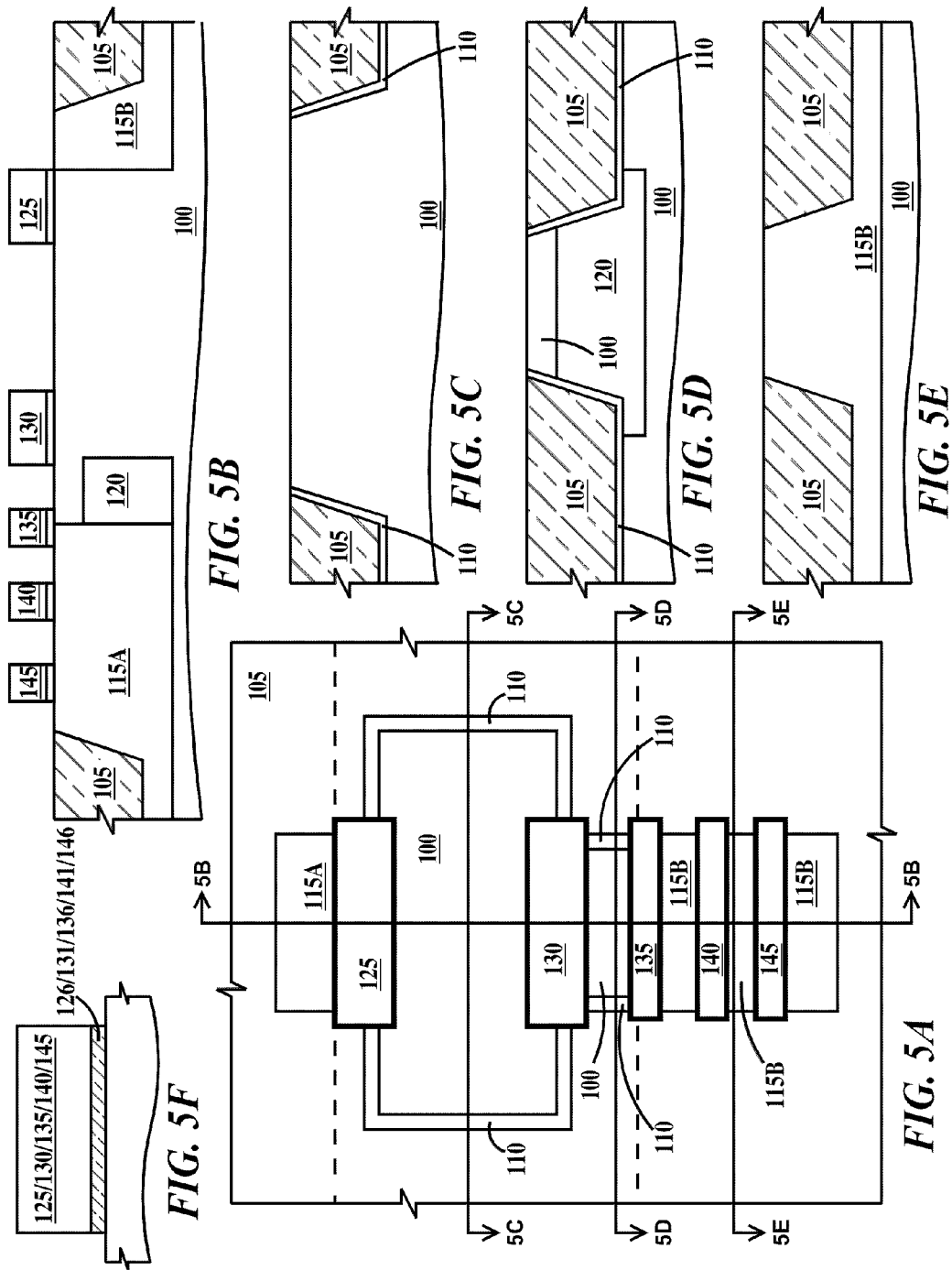

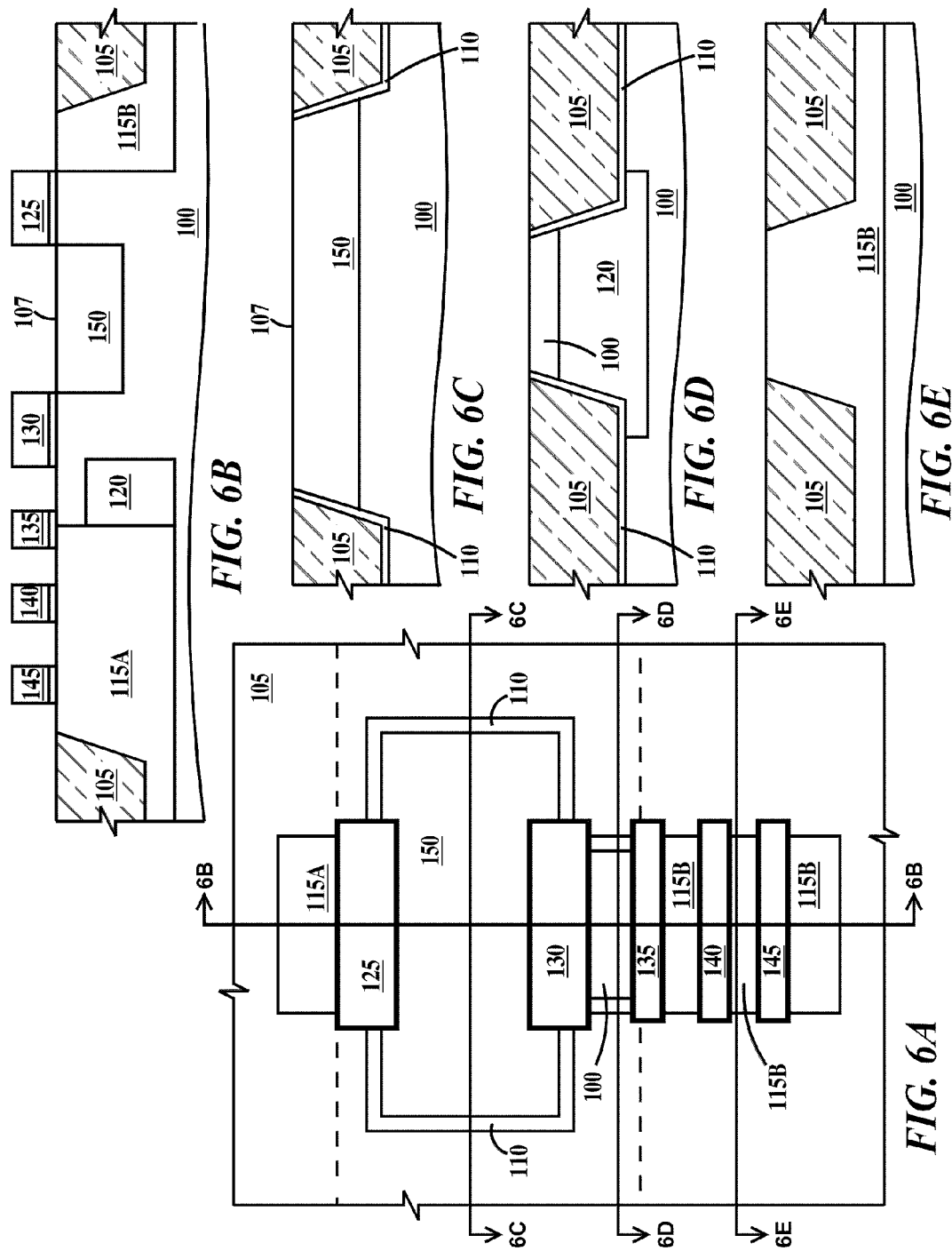

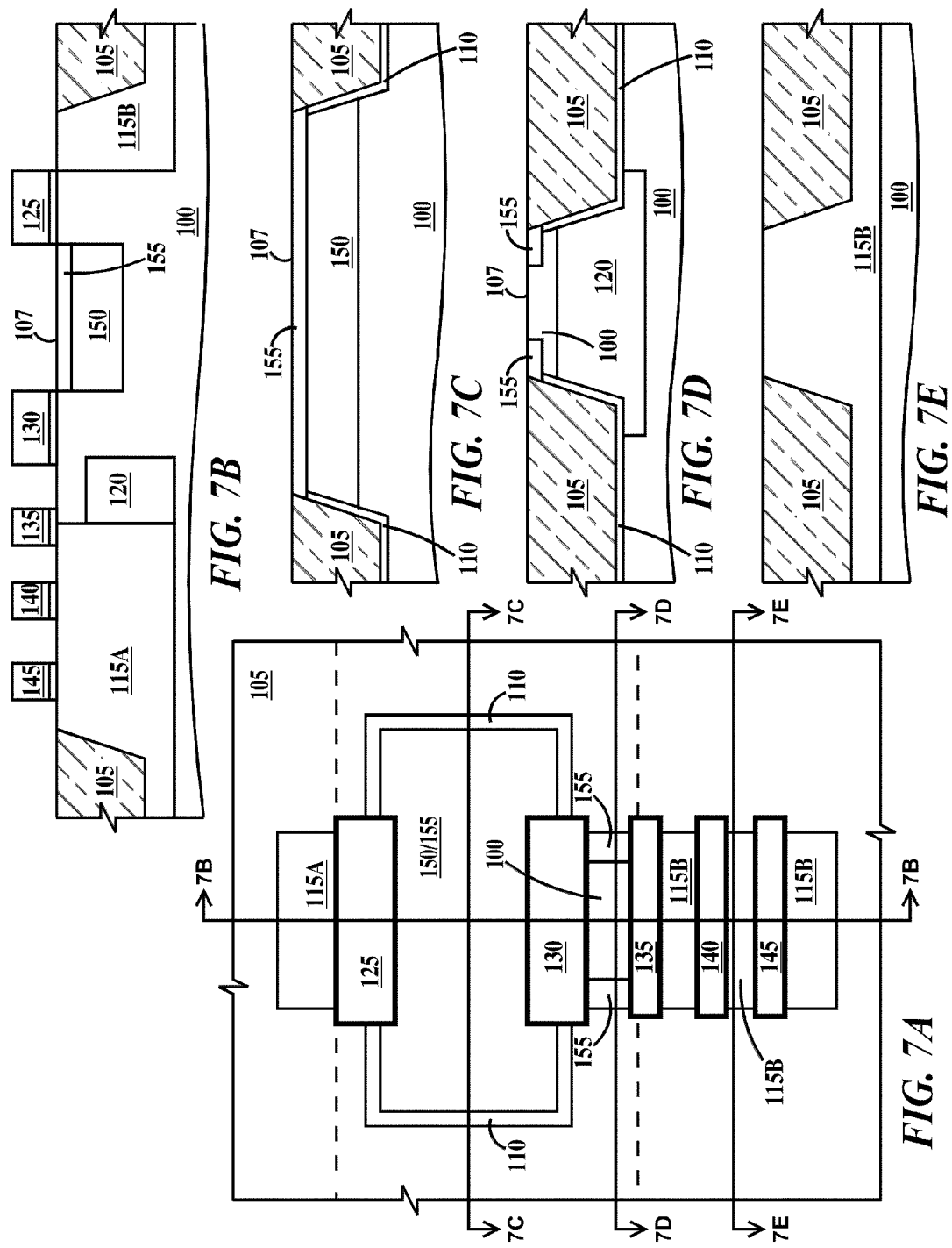

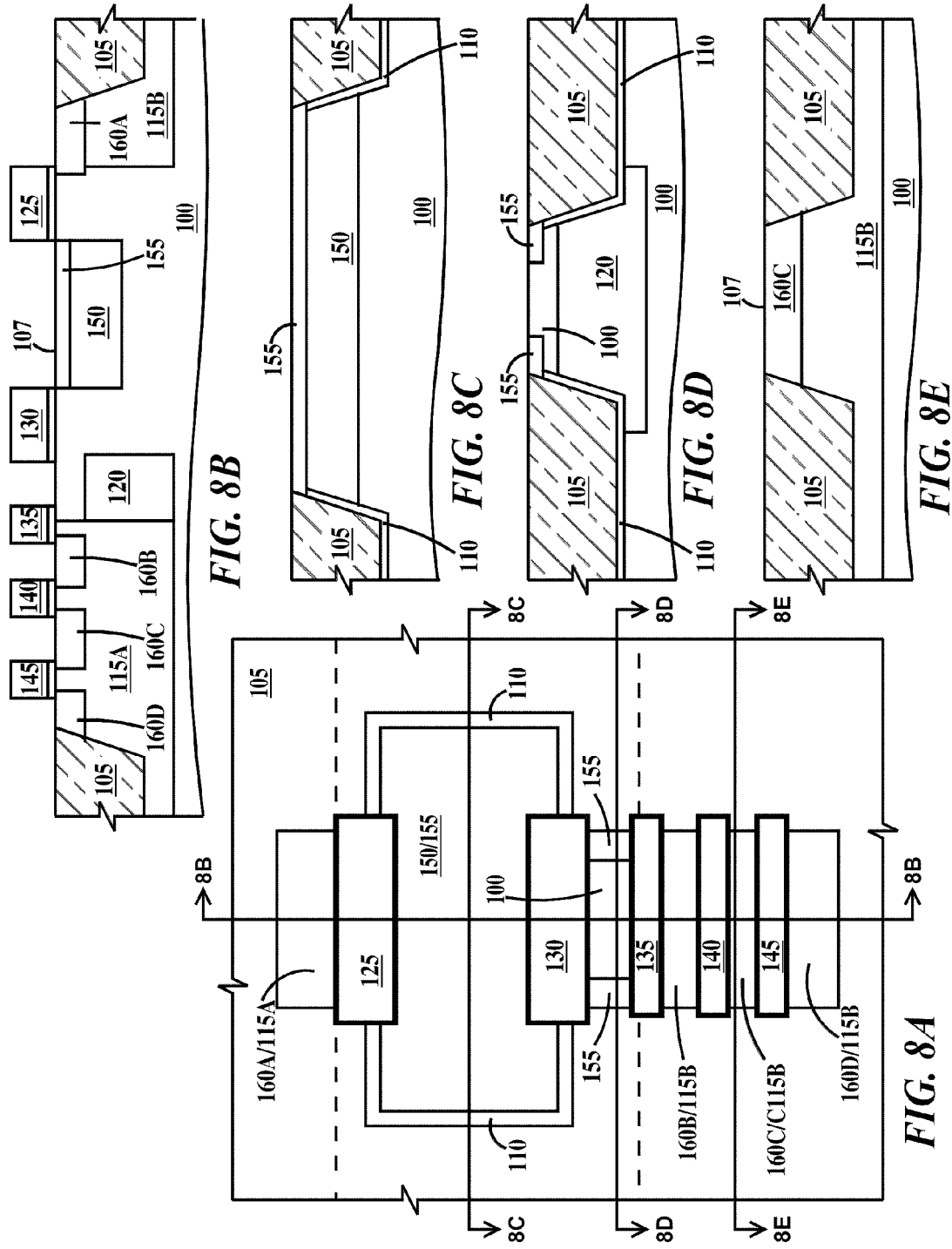

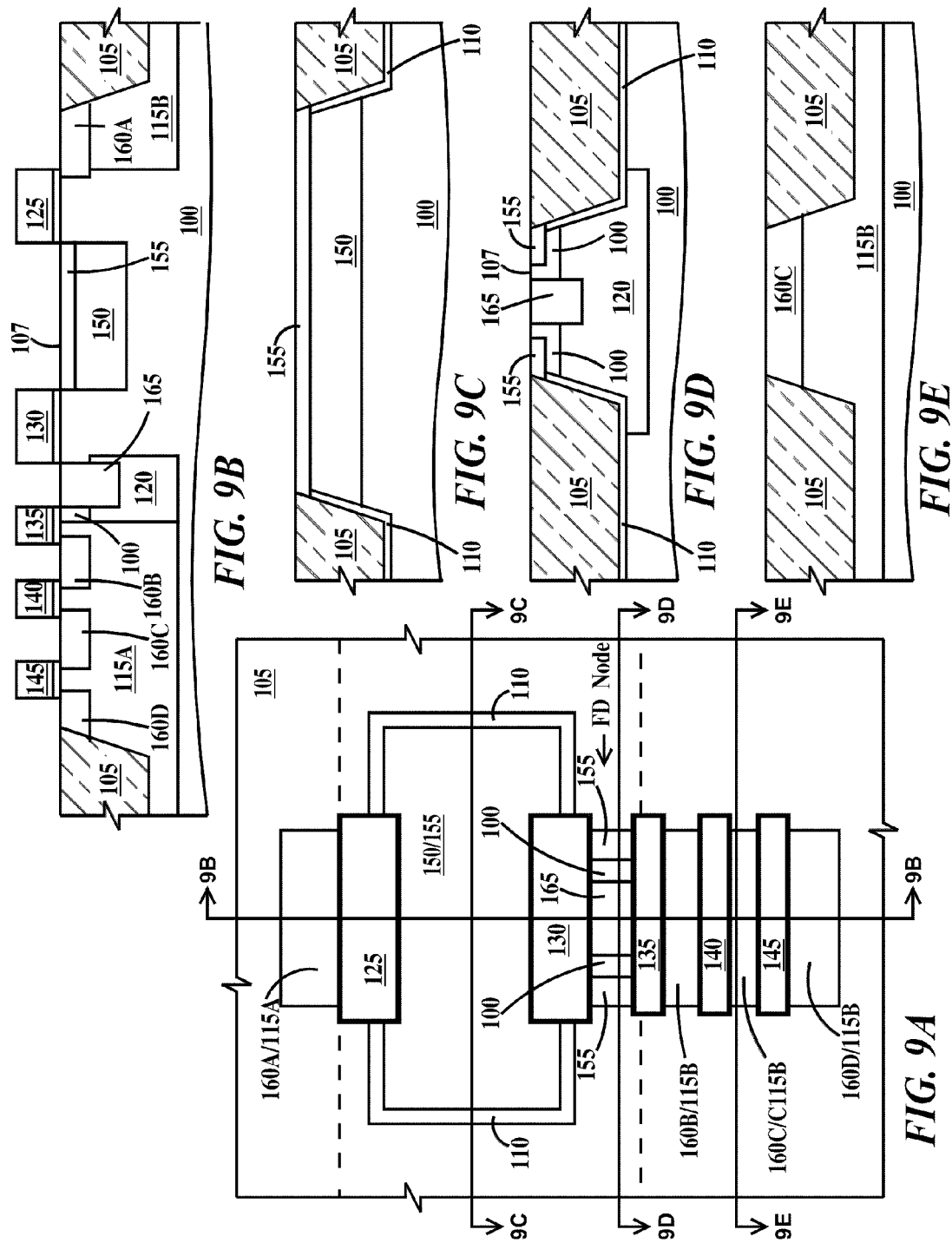

STRUCTURES, DESIGN STRUCTURES AND METHODS OF FABRICATING GLOBAL SHUTTER PIXEL SENSOR CELLS

FIELD OF THE INVENTION

The present invention relates to the field of solid-state image sensing devices; more specifically, it relates to CMOS based pixel sensor cell devices, methods of fabricating CMOS based pixel sensor cell devices and design structures for CMOS based pixel sensor cell devices.

BACKGROUND

Current CMOS (complementary metal oxide semiconductor) based image sensors suffer from one of two deficiencies depending upon the shutter system used. In rolling shutter systems the pixel sensor cells are exposed at different times. In global shutter systems, the signal strength from the pixel sensor cells can vary. In both cases, less than ideal images are produced. Accordingly, there exists a need in the art to mitigate the deficiencies and limitations described hereinabove.

SUMMARY

A first aspect of the present invention is a pixel sensor cell, comprising: a photodiode body in a first region of a semiconductor layer; a floating diffusion node in a second region of the semiconductor layer, a third region of the semiconductor layer between and abutting the first and second regions; and dielectric isolation in the semiconductor layer, the dielectric isolation surrounding the first, second and third regions, the dielectric isolation abutting the first, second and third regions and the photodiode body, the dielectric isolation not abutting the floating diffusion node, portions of the second region intervening between the dielectric isolation and the floating diffusion node.

A second aspect of the present invention is a method of fabricating a pixel sensor cell, comprising: forming a photodiode body in a first region of a semiconductor layer; forming a floating diffusion node in a second region of the semiconductor layer, a third region of the semiconductor layer between and abutting the first and second regions; and forming dielectric isolation in the semiconductor layer, the dielectric isolation surrounding the first, second and third regions, the dielectric isolation abutting the first, second and third regions and the photodiode body, the dielectric isolation not abutting the floating diffusion node, portions of the second region intervening between the dielectric isolation and the floating diffusion node.

A third aspect of the present invention is a design structure comprising design data tangibly embodied in a machine-readable medium, the design data being used for designing, manufacturing, or testing an integrated circuit, the design data comprising information describing a pixel sensor cell the pixel sensor cell comprising: a photodiode body in a first region of a semiconductor layer; a floating diffusion node in a second region of the semiconductor layer, a third region of the semiconductor layer between and abutting the first and second regions; and dielectric isolation in the semiconductor layer, the dielectric isolation surrounding the first, second and third regions, the dielectric isolation abutting the first, second and third regions and the photodiode body, the dielectric isolation not abutting the floating diffusion node, portions of the second region intervening between the dielectric isolation and the floating diffusion node.

These and other aspects of the invention are described below.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIG. 1A is a top view and FIGS. 1B, 1C, 1D and 1E are cross-sections through respective lines 1B-1B, 1C-1C, 1D-1D and 1E-1E of FIG. 1A illustrating fabrication of a pixel sensor cell according to embodiments of the present invention;

FIG. 2A is a top view and FIGS. 2B, 2C, 2D and 2E are cross-sections through respective lines 2B-2B, 2C-2C, 2D-2D and 2E-2E of FIG. 2A illustrating continuing fabrication of a pixel sensor cell according to embodiments of the present invention;

FIG. 3A is a top view and FIGS. 3B, 3C, 3D and 3E are cross-sections through respective lines 3B-3B, 3C-3C, 3D-3D and 3E-3E of FIG. 3A illustrating continuing fabrication of a pixel sensor cell according to embodiments of the present invention;

FIG. 4A is a top view and FIGS. 4B, 4C, 4D and 4E are cross-sections through respective lines 4B-4B, 4C-4C, 4D-4D and 4E-4E of FIG. 4A illustrating continuing fabrication of a pixel sensor cell according to embodiments of the present invention;

FIG. 5A is a top view and FIGS. 5B, 5C, 5D and 5E are cross-sections through respective lines 5B-5B, 5C-5C, 5D-5D and 5E-5E of FIG. 5A illustrating continuing fabrication of a pixel sensor cell according to embodiments of the present invention;

FIG. 5F is a cross-section illustrating gate structures through line 5B-5B of FIG. 5A;

FIG. 6A is a top view and FIGS. 6B, 6C, 6D and 6E are cross-sections through respective lines 6B-6B, 6C-6C, 6D-6D and 6E-6E of FIG. 6A illustrating continuing fabrication of a pixel sensor cell according to embodiments of the present invention;

FIG. 7A is a top view and FIGS. 7B, 7C, 7D and 7E are cross-sections through respective lines 7B-7B, 7C-7C, 7D-7D and 7E-7E of FIG. 7A illustrating continuing fabrication of a pixel sensor cell according to embodiments of the present invention;

FIG. 8A is a top view and FIGS. 8B, 8C, 8D and 8E are cross-sections through respective lines 8B-8B, 8C-8C, 8D-8D and 8E-8E of FIG. 8A illustrating continuing fabrication of a pixel sensor cell according to embodiments of the present invention;

FIG. 9A is a top view and FIGS. 9B, 9C, 9D and 9E are cross-sections through respective lines 9B-9B, 9C-9C, 9D-9D and 9E-9E of FIG. 9A illustrating continuing fabrication of a pixel sensor cell according to embodiments of the present invention;

DETAILED DESCRIPTION

Figure 10A:
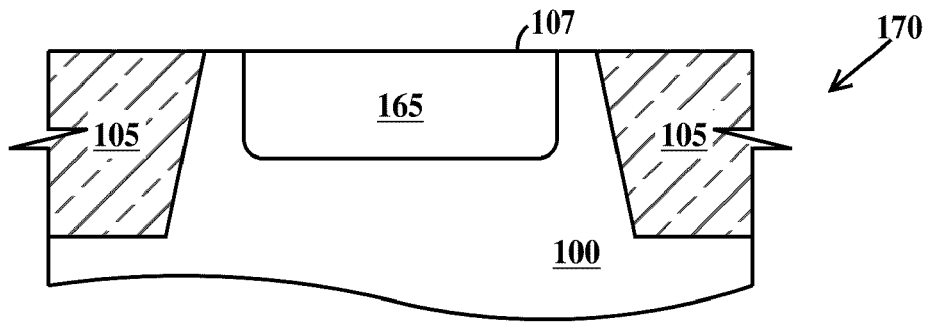
FIGS. 10A, 10B, 10C and 10D illustrate alternative structures for the storage node of a pixel sensor cell according to embodiments of the present invention.

Solid state imaging devices contain CMOS based pixel sensor cells arranged in an array of rows and columns and a shutter mechanism to expose the pixel sensor cell array.

In rolling shutter methodology the image is captured on a row-by-row basis. For a given row the image is captured by photodiodes, transferred to floating diffusion nodes, and then the nodes are read out to column sample circuits before moving on to the next row. This repeats until the all the pixel sensor cell rows are captured and read out. In the resulting image each row represents the subject at a different time. Thus for highly dynamic subjects (such as objects moving at a high rate of speed) the rolling shutter methodology can create image artifacts.

In a global shutter methodology, the image is captured for the whole frame in the photodiodes at the same time for all the rows and columns of the pixel sensor cell array. Then the image signal is transferred to the floating diffusion nodes where it is stored until it is read out on a row-by-row basis. The global shutter method solves the problem with image capture of high speed subjects, but introduces the problem of charge level change on the charge storage node of the pixel sensor cell.

In the rolling shutter method, the image signal is held in the charge storage nodes for a significantly shorter time than the actual time of exposure of the photodiode, and this hold time is the same for all pixel sensor cells in the array, making correction for charge level change in storage node simple with standard CDS techniques. In the global shutter method, the image signal is held in the storage node for varying amounts of time. The time in the first row being the shortest time (the time to read out a single row) with the time in the last row being the longest time (the time to read all rows). Thus any charge generation or leakage occurring on storage node can have a significant impact to the signal being read out of the row.

In order to improve on the global shutter efficiency the embodiments of the present invention reduce the amount of change to the charge being held on the floating diffusion node of the pixel sensor cell. The embodiments of the present invention use unique well and floating diffusion node ion implantation design levels/masks to create floating diffusion nodes that have minimal dark current generation and leakage caused by stray carriers that may be generated in adjacent semiconductor regions. In embodiments of the present invention, the drain ion implant design level/mask leaves a space between the floating diffusion node and the dielectric isolation sidewalls. The well ion implantation design level/mask is designed such that the well extends under the floating diffusion node and the dielectric isolation.

Optionally, an electron shield ion implantation design level/mask is provided. Optionally, a dielectric trench sidewall passivation ion implantation design level/mask is provided, which reduces carrier generation that can occur along the dielectric isolation sidewall surfaces. Optionally a surface pinning ion implantation design level/mask is provided which passivates the surface of the photodiode and the floating diffusion node. The fabrication process infra is presented in a preferred order, but other orders are possible.

FIG. 1A is a top view and FIGS. 1B, 1C, 1D and 1E are cross-sections through respective lines 1B-1B, 1C-1C, 1D-1D and 1E-1E of FIG. 1A illustrating fabrication of a pixel sensor cell according to embodiments of the present invention. In FIGS. 1A, 1B, 1C, 1D and 1E, formed on semiconductor layer 100 is dielectric trench isolation 105. In one example, semiconductor layer 100 is a single crystal silicon substrate or an epitaxial single crystal silicon layer on a single crystal silicon or semiconductor substrate. In one example, semiconductor layer is an upper semiconductor layer (which may be a single crystal silicon layer) of a semiconductor-on-insulator substrate comprising the upper semiconductor layer separated from a lower semiconductor layer (which may be a single crystal silicon layer) by a buried oxide (BOX) layer. Dielectric isolation 105 is formed, for example, by photolithographically defining and etching a trench in substrate 100, then filling the trench with a dielectric material (e.g., SiO2) and performing a chemical-mechanical-polish to coplanarize a top surface 106 of dielectric isolation with a top surface 107 of substrate 100. In one example, semiconductor layer 100 is doped P-type.

A photolithographic process is one in which a photoresist layer is applied to a surface of a substrate, the photoresist layer exposed to actinic radiation through a patterned photomask (fabricated based on a design level) and the exposed photoresist layer developed to form a patterned photoresist layer. When the photoresist layer comprises positive photoresist, the developer dissolves the regions of the photoresist exposed to the actinic radiation and does not dissolve the regions where the patterned photomask blocked (or greatly attenuated the intensity of the radiation) from impinging on the photoresist layer. When the photoresist layer comprises negative photoresist, the developer does not dissolve the regions of the photoresist exposed to the actinic radiation and does dissolve the regions where the patterned photomask blocked (or greatly attenuated the intensity of the radiation) from impinging on the photoresist layer. After processing (e.g., an etch or an ion implantation), the patterned photoresist is removed. Processing results in a physical change to the substrate.

FIG. 2A is a top view and FIGS. 2B, 2C, 2D and 2E are cross-sections through respective lines 2B-2B, 2C-2C, 2D-2D and 2E-2E of FIG. 2A illustrating continuing fabrication of a pixel sensor cell according to embodiments of the present invention. In FIGS. 2A, 2C and 2D an optional dielectric passivation layer 110 is formed in semiconductor layer 100 along selected surfaces of dielectric isolation. Dielectric passivation layer 110 is formed, in one example, by photolithographically defining and then ion implanting a selected region of substrate 100. In one example, dielectric passivation layer 100 is doped P-type. In FIGS. 2C and 2D dielectric passivation layer 110 extends along the sidewalls and bottom surfaces of dielectric isolation 105. FIG. 2C illustrates a region of semiconductor layer 100 where a photodiode will be subsequently formed and FIG. 2D illustrates a region of the semiconductor layer 100 where a floating diffusion node will be subsequently formed.

FIG. 3A is a top view and FIGS. 3B, 3C, 3D and 3E are cross-sections through respective lines 3B-3B, 3C-3C, 3D-3D and 3E-3E of FIG. 3A illustrating continuing fabrication of a pixel sensor cell according to embodiments of the present invention. In FIGS. 3A, 3B and 3E, first and second wells 115A and 115B are formed in semiconductor layer 100. First and second P-wells 115A and 115B are simultaneously formed, in one example, by photolithographically defining and then ion implanting selected regions of substrate 100. In one example, first and second wells 115A and 115B are doped P-type. In FIGS. 3B and 3E, first and second wells 115A and 115B extends along the bottom surfaces of dielectric isolation 105. Wells are not formed in FIG. 3C (where the photodiode will be subsequently formed) and FIG. 3D (where the floating diffusion node will be subsequently formed).

FIG. 4A is a top view and FIGS. 4B, 4C, 4D and 4E are cross-sections through respective lines 4B-4B, 4C-4C, 4D-4D and 4E-4E of FIG. 4A illustrating continuing fabrication of a pixel sensor cell according to embodiments of the present invention. In FIGS. 4A, 4B and 4D, an optional electron shield 120 formed in semiconductor layer 100. Electron shield 120 is formed, in one example, by photolithographically defining and then ion implanting selected regions of substrate 100. In one example, electron shield 120 is doped P-type. In FIGS. 4B and 4E, electron shield 120 is a buried layer and does not extend to top surface 107 of semiconductor layer 100, a region of semiconductor layer 100 above electron shield 120 intervening. Electron shield 120 extends along the bottom surfaces of dielectric isolation 105. In FIG. 4D, (where the floating diffusion node will be subsequently formed) electron shield 120 abuts (i.e., abuts) dielectric passivation layer 110 and extend under dielectric passivation 105. If dielectric passivation layer 110 is not present, electron shield 120 abuts dielectric isolation 105.

FIG. 5A is a top view and FIGS. 5B, 5C, 5D and 5E are cross-sections through respective lines 5B-5B, 5C-5C, 5D-5D and 5E-5E of FIG. 5A illustrating continuing fabrication of a pixel sensor cell according to embodiments of the present invention. In FIGS. 5A and 5B gate electrodes 125, 130, 135, 140 and 145 are foamed. Bold lines illustrate perimeters of gate electrodes 125, 130, 135, 140 and 145. In one example, gate electrodes 125, 130, 135, 140 and 145 may be simultaneously formed by depositing a gate dielectric layer, then a polysilicon layer on the gate dielectric later followed by photolithographically defining and then etching away unprotected (by the patterned photoresist layer) regions of the polysilicon layer.

FIG. 5F is a cross-section illustrating gate structures through line 5B-5B of FIG. 5A. In FIG. 5F, gate dielectric layers 126, 131, 136, 141 and 146 intervene between respective gate electrodes 125, 130, 135, 140 and 145 and semiconductor layer 100. There are five gate electrodes as the completed pixel sensor cell will be a five-transistor pixel sensor cell.

FIG. 6A is a top view and FIGS. 6B, 6C, 6D and 6E are cross-sections through respective lines 6B-6B, 6C-6C, 6D-6D and 6E-6E of FIG. 6A illustrating continuing fabrication of a pixel sensor cell according to embodiments of the present invention. In FIGS. 6A, 6B and 6C, a photodiode body 150 is Rained in semiconductor layer 100. Photodiode body 150 is formed, in one example, by photolithographically defining and then ion implanting selected regions of substrate 100. In one example, photodiode body 150 is doped N-type. When photodiode body is N-type and semiconductor layer 100 is P-type, photodiode body 150 forms the cathode and semiconductor layer 100 forms the anode of the photodiode. In FIGS. 6B and 6C, photodiode body 150 does not extend as deep into semiconductor layer 100 as dielectric isolation and abuts dielectric passivation layer 110. In FIGS. 6B and 6C, photodiode body 150 is a buried structure and does not extend to top surface 107 of semiconductor layer 100, a region of semiconductor layer 100 above photodiode body 150 intervening. In FIG. 6C, photodiode body 150 abuts dielectric isolation passivation layer 110. If dielectric isolation passivation layer 110 is not present, then photodiode body 150 abuts dielectric isolation 105 directly.

FIG. 7A is a top view and FIGS. 7B, 7C, 7D and 7E are cross-sections through respective lines 7B-7B, 7C-7C, 7D-7D and 7E-7E of FIG. 7A illustrating continuing fabrication of a pixel sensor cell according to embodiments of the present invention. In FIGS. 7A, 7B, 7C and 7D, an optional pinning layer 155 is formed in semiconductor layer 100. Pinning layer 155 is formed, in one example, by photolithographically defining and then ion implanting selected regions of substrate 100. In one example, pinning layer 155 is doped P-type. In FIGS. 7B and 7D, pinning layer 155 extends from top surface 107 of semiconductor layer 100 to photodiode body 150. In FIG. 7D, (where the floating diffusion node will be subsequently formed) pinning layer 155 extends from top surface 107 of semiconductor layer 100, toward but does not abut electron shield 120 if electron shield 120 is present. If electron shield 120 is present, a region of semiconductor layer intervenes 100 between pinning layer 155 and electron shield 120. In FIG. 7D, pinning layer 155 abuts dielectric isolation 105 and overlaps opposite side of electron shield 120. A region of top surface 107 of semiconductor layer 100 is exposed between regions of pinning layer 155. In FIG. 7D, if dielectric passivation layer 110 is present, pinning layer 155 abuts dielectric passivation layer 105.

FIG. 8A is a top view and FIGS. 8B, 8C, 8D and 8E are cross-sections through respective lines 8B-8B, 8C-8C, 8D-8D and 8E-8E of FIG. 8A illustrating continuing fabrication of a pixel sensor cell according to embodiments of the present invention. In FIGS. 8A, 8B and 8E, source/drains 160A, 160B, 160C and 160D are formed in semiconductor layer 100. Source/drains 160A, 160B, 160C and 160D are simultaneously formed, in one example, by photolithographically defining and then ion implanting selected regions of substrate 100. In one example, source/drains 160A, 160B, 160C and 160D are doped N-type. In FIG. 8C (where the photodiode has been formed), FIG. 8D, where the floating diffusion node will be formed) first source/drains have not been formed. Source/drains 160A, 160B, 160C and 160D extend from top surface 107 of semiconductor layer 100 a distance that lees than the distance dielectric isolation extend into semiconductor layer 100.

FIG. 9A is a top view and FIGS. 9B, 9C, 9D and 9E are cross-sections through respective lines 9B-9B, 9C-9C, 9D-9D and 9E-9E of FIG. 9A illustrating continuing fabrication of a pixel sensor cell according to embodiments of the present invention. In FIGS. 9A, 9B and 9D, a floating diffusion node 165 is formed in semiconductor layer 100. Floating diffusion node 165 is formed, in one example, by photolithographically defining and then ion implanting selected regions of substrate 100. In one example, floating diffusion node 165 is doped N-type. In FIGS. 9B and 9D, floating diffusion node 165 extends from top surface 107 of semiconductor layer 100 into but not through electron shield 120 (if electron shield 120 is present). FIG. 9D illustrates the floating diffusion node (FD node) with all optional elements. It is a feature of the embodiments of the present invention that floating diffusion node 165 does not abut dielectric isolation 105. It is a feature of the embodiments of the present invention that floating diffusion node 165 does not abut pinning layer 155 (if pinning layer 155 is present). It is a feature of the embodiments of the present invention that floating diffusion node 165 does not extend to dielectric isolation passivation layer 110 (if dielectric isolation passivation layer 110 is present). In FIG. 9D, a region of semiconductor layer 100 intervenes between floating diffusion node and dielectric isolation 105 and/or dielectric isolation passivation layer 110 and/or pinning layer 155.

FIGS. 10A, 10B, 10C and 10D illustrate alternative structures for the storage node of a pixel sensor cell according to embodiments of the present invention. FIGS. 10A, 10B, 10C and 10D illustrate four possible combinations of the structural elements defining charge storage nodes according to the embodiments of the present invention.

In FIG. 10A, a first charge storage node 170 includes floating diffusion node 165 and semiconductor layer 100. Floating diffusion node 165 does not abut dielectric isolation 105, semiconductor layer 100 intervening between floating diffusion node 165 and dielectric isolation 105. This is the minimum number of elements for a floating diffusion node according to embodiments of the present invention.

Figure 10B:
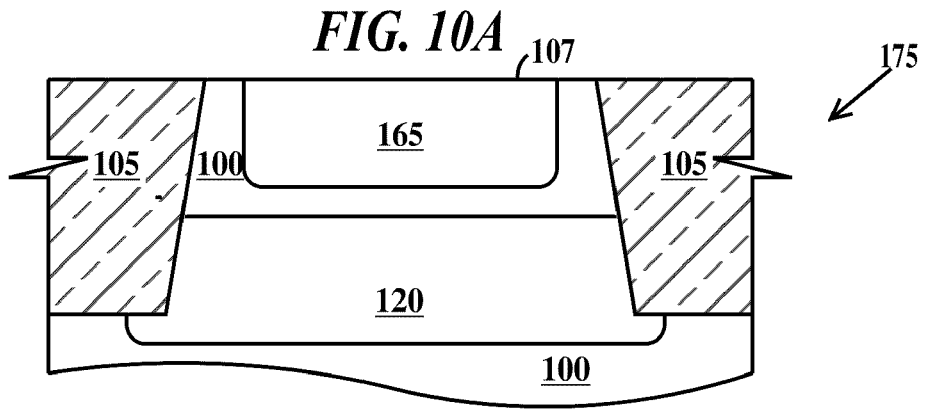

In FIG. 10B, a second charge storage node 175 includes floating diffusion node 165, semiconductor layer 100 and electron shield 120. Floating diffusion node 165 does not extend to dielectric isolation 105, semiconductor layer 100 intervening between floating diffusion node 165 and dielectric isolation 105. Electron shield 120 abuts dielectric isolation 105. Electron shield 120 does not abut top surface 107 of semiconductor layer 100, regions of semiconductor layer 100 intervening between electron shield 120 and top surface 107 of semiconductor layer 100. Floating diffusion node 165 extends into semiconductor layer 100 but not to electron shield 120, a region of semiconductor layer 100 intervening between floating diffusion node 165 and electron shield 120. Alternatively, floating diffusion node 165 extends to electron shield 120 or extends part way into electron shield 120.

Figure 10C:
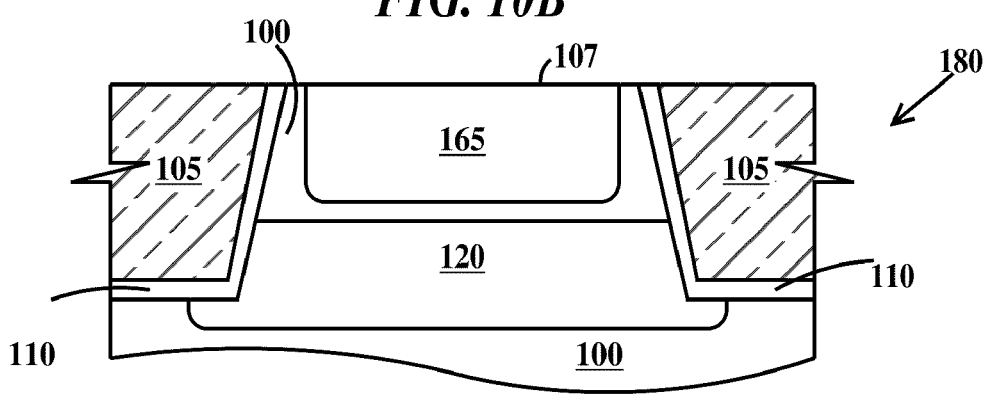

In FIG. 10C, a third charge storage node 180 includes floating diffusion node 165, semiconductor layer 100, electron shield 120, and dielectric isolation passivation layer 110. Dielectric isolation passivation layer 110 abuts sidewalls and bottom surface of dielectric isolation 105. Floating diffusion node 165 does not abut dielectric isolation passivation layer 110, a region of semiconductor layer 100 intervening between floating diffusion node 165 and dielectric isolation passivation layer 110. Electron shield 120 abuts dielectric isolation passivation layer 110. Electron shield 120 does not abut top surface 107 of semiconductor layer 100, regions of semiconductor layer 100 intervening between electron shield 120 and top surface 107 of semiconductor layer 100. Floating diffusion node 165 extends into semiconductor layer 100 but not to electron shield 120, a region of semiconductor layer 100 intervening between floating diffusion node 165 and electron shield 120. Alternatively, floating diffusion node 165 extends to electron shield 120 or extends part way into electron shield 120.

Figure 10D:
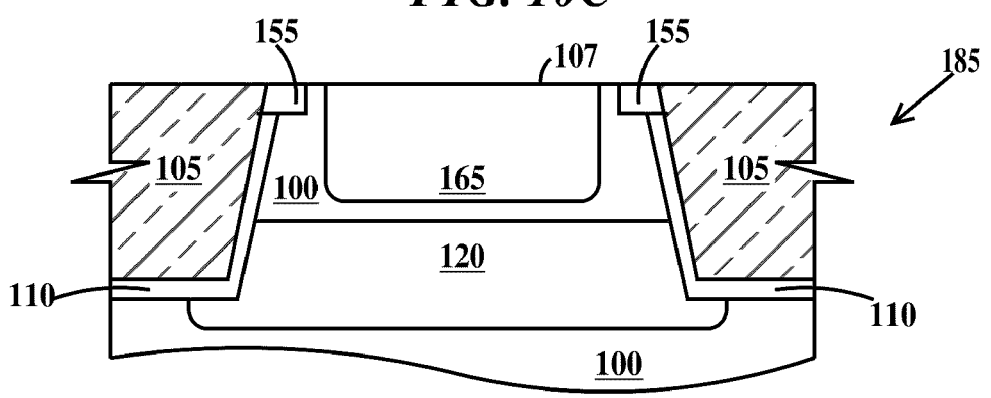

In FIG. 10D, a fourth charge storage node 185 includes floating diffusion node 165, semiconductor layer 100, electron shield 120, dielectric isolation passivation layer 110 and pinning layer 155. Dielectric isolation passivation layer 110 abuts sidewalls and a bottom surface of dielectric isolation 105. Floating diffusion node 165 does not abut dielectric isolation passivation layer 110, semiconductor layer 100 intervening between floating diffusion node 165 and dielectric isolation passivation layer 110. Electron shield 120 abuts dielectric isolation passivation layer 110. Electron shield 120 does not abut top surface 107 of semiconductor layer 100, regions of semiconductor layer 100 intervening between electron shield 120 and top surface 107 of semiconductor layer 100. Floating diffusion node 165 extends into semiconductor layer 100 from top surface 107 but not to electron shield 120, a region of semiconductor layer 100 intervening between floating diffusion node 165 and electron shield 120. Alternatively, floating diffusion node 165 extends to electron shield 120 or extends part way into electron shield 120. Pinning layer 155 extends from top surface 107 into semiconductor layer 100 and along top surface 107 toward floating diffusion node 165 but does not abut floating diffusion node 165, a region of semiconductor layer 100 intervening. Alternatively, pinning layer 155 extends to abut floating diffusion node 165. Pinning layer 155 abuts dielectric isolation 105, dielectric passivation layer 110 and regions of semiconductor layer 100 but not electron shield 120. A region of semiconductor layer 100 intervenes between pinning layer 155 and electron shield 120.

Other possible combinations for charge storage nodes according to embodiments of the present invention include floating diffusion node 165 with a region of semiconductor layer 100 intervening between floating diffusion node 165 and dielectric isolation 105 in combination with (i) only dielectric isolation passivation layer 110, (ii) only dielectric isolation passivation layer 110 and pinning layer 155, (iii) only pinning layer 155, and (iv) only pinning layer 155 and electron shield 120.

Figures 11, 12:
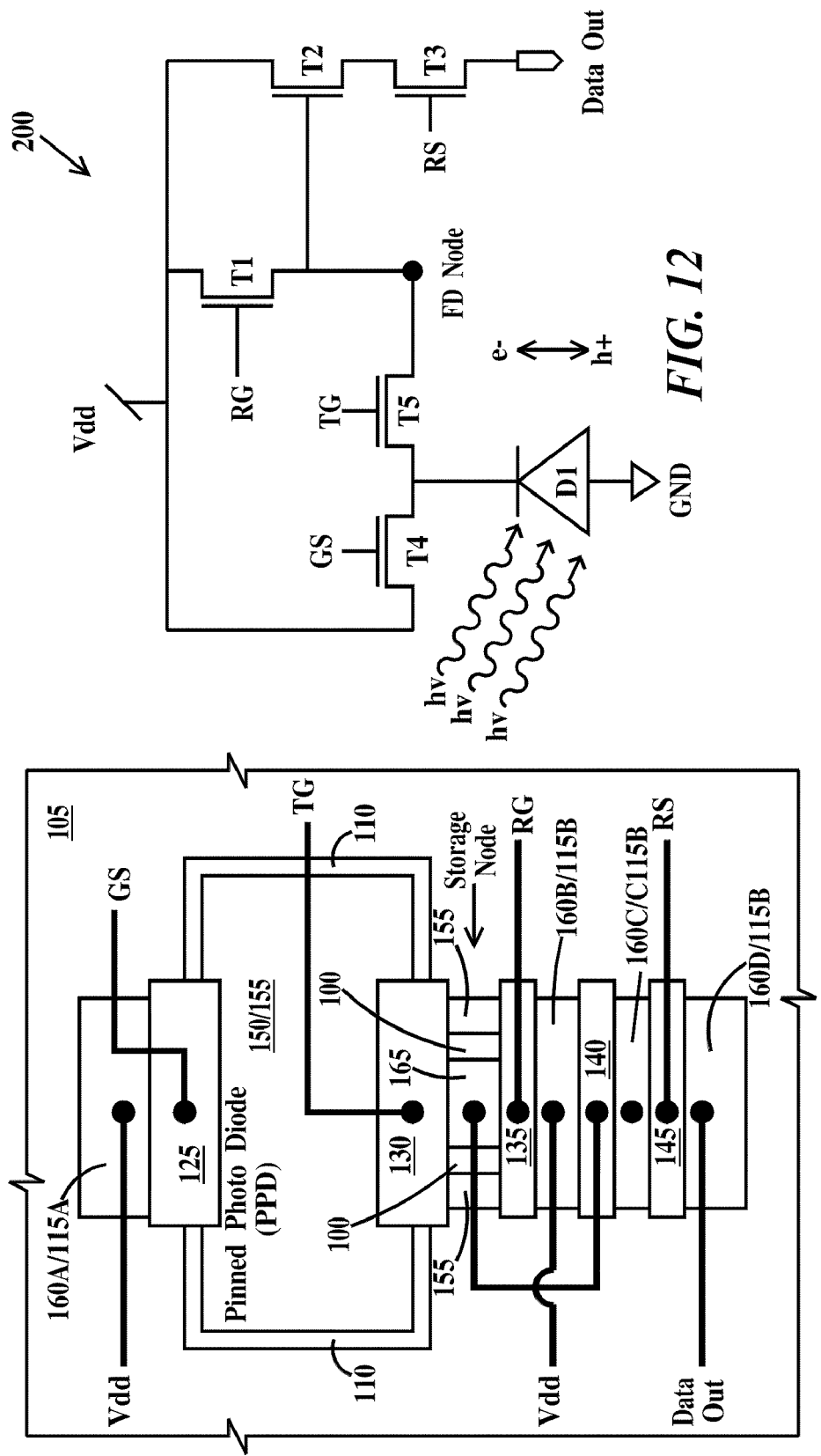
FIG. 11 is a top view of illustrating interconnections of the structural elements in a pixel sensor cell circuit.
FIG. 12 is a circuit diagram of a pixel sensor cell circuit according to embodiments of the present invention.

FIG. 11 is a top view of illustrating interconnections of the structural elements in a pixel sensor cell circuit. FIG. 11 is similar to FIG. 9. In FIG. 11, source/drain 160A is connected to Vdd, gate 125 is connected to a global shutter signal (GS), gate 130 is connected to a transfer gate signal (TG), floating diffusion node 165 is connected to gate 140, gate 135 is connected to a reset gate signal (RG), source/drain 160B is connected to Vdd, gate 145 is connected to a row select signal (RS), and source/drain 160D is connected to Data Out.

FIG. 12 is a circuit diagram of a pixel sensor cell circuit according to embodiments of the present invention. In FIG. 12, circuit 200 describes device of FIG. 11. Circuit 200 includes NFETs T1 (reset transistor), T2 (source follower), T3 (row select transistor), T4 (global shutter transistor) and T5 (transfer gate), and photodiode D1 (photon detector). The gate of NFET T1 is connected to RG, the gate of NFET T2 is connected to the floating diffusion node (FD Node), the gate of NFET T3 is connected to RS, the gate of NFET T4 is connected to GS and the gate of NFET T5 is connected to TG. The drains of NFETS T1, T2 and T4 are connected to Vdd. The source of NFET T1 is connected to the FD Node, the drain of NFET T2 to the source of NFET T3 and the source of NFET T3 to Data Out. The source of NFET T4 is connected to the source of NFET T5 and the drain of NFET T5 is connected to FD Node. The cathode of diode D1 is connected to the sources of NFETS T4 and T5 and the anode of diode D1 is connected to GND. Diode D1 is the pinned photo diode of FIG. 11.

Circuit 200 utilizes NFETs. However, NFETs T1, T2, T3, T4 and T5 can be replaced by PFETs. In a circuit utilizing PFETs, the doping type of elements of FIG. 11 are changed. Semiconductor layer 100, dielectric passivation layer 110, wells 115A and 115B, electron shield 120 and pinning layer 155 are doped N-type and photodiode body 150, source/drains 160A, 160B, 160C and 160D and floating diffusion node 165 are doped P-type. Also Vdd and GND are reversed, and the anode of diode D1 is connected to the now drains of now PFETS T4 and T5.

Figure 13:
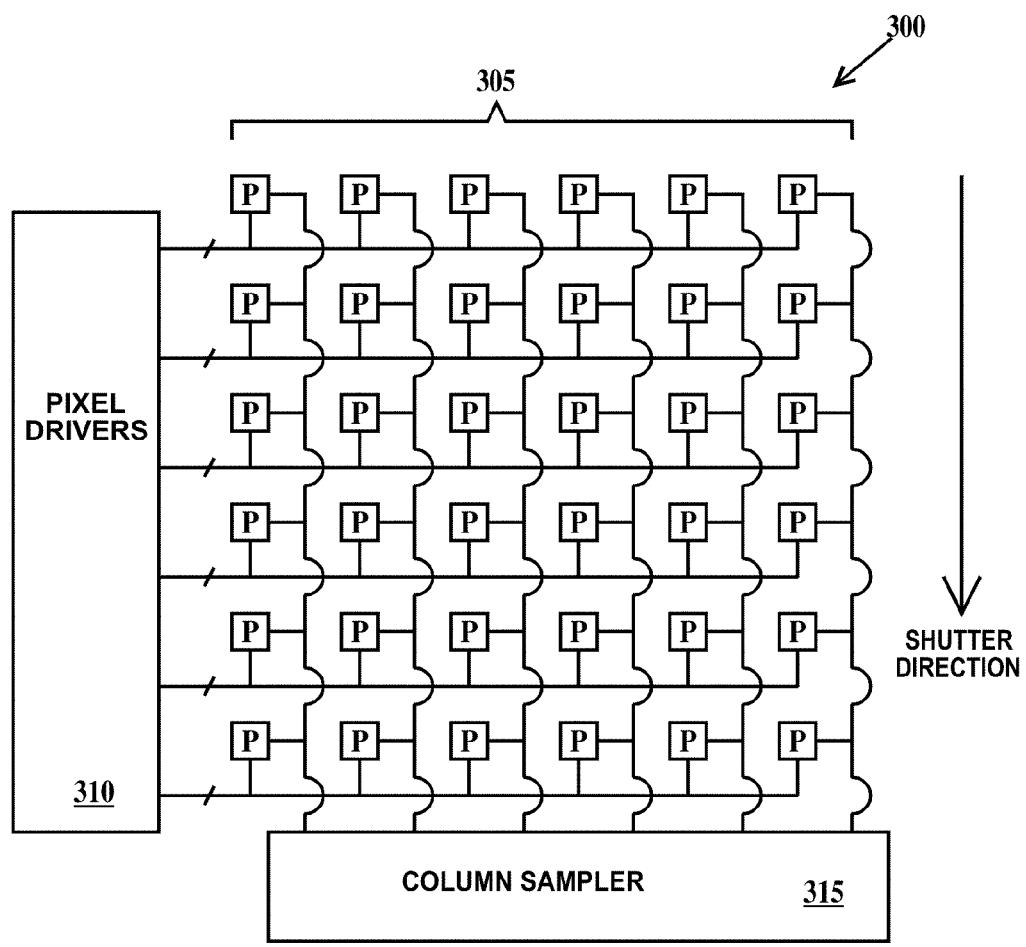
FIG. 13 is a diagram illustrating an array of global shutter pixel sensor cells according to embodiments of the present invention.

FIG. 13 is a diagram illustrating an array of global shutter pixel sensor cells according to embodiments of the present invention. In FIG. 13, an image sensor 300 includes an array 305 of pixel sensor cells P (rows are horizontal and columns vertical), pixel sensor cell drivers 3190 and a column sampler 315. Each pixel sensor cell P is a circuit 200 of FIG. 11. The GS, TG, RG, and RS signals of FIG. 12 are connected to pixel sensor cells P from pixel sensor cell row drivers 310. The Data Out signals of FIG. 12 from pixel sensor cells P are connected to column sampler 315.

In operation a global exposure is performed by (1) pulsing GS on/off (on=high for an NFET, off=low for an NFET) to charge the photodiode (exposure starts at off), (2) resetting FD Node by pulsing RG on/off, and (3) puling TG on/off to move the charge to FD Node. Readout is performed by (1) turning on RS to read all columns in a selected row and (2) pulsing RG on/off after reading the selected row. Readout steps (1) and (2) are repeated for each row sequentially, starting with the first row and ending with the last row.

Figure 14:
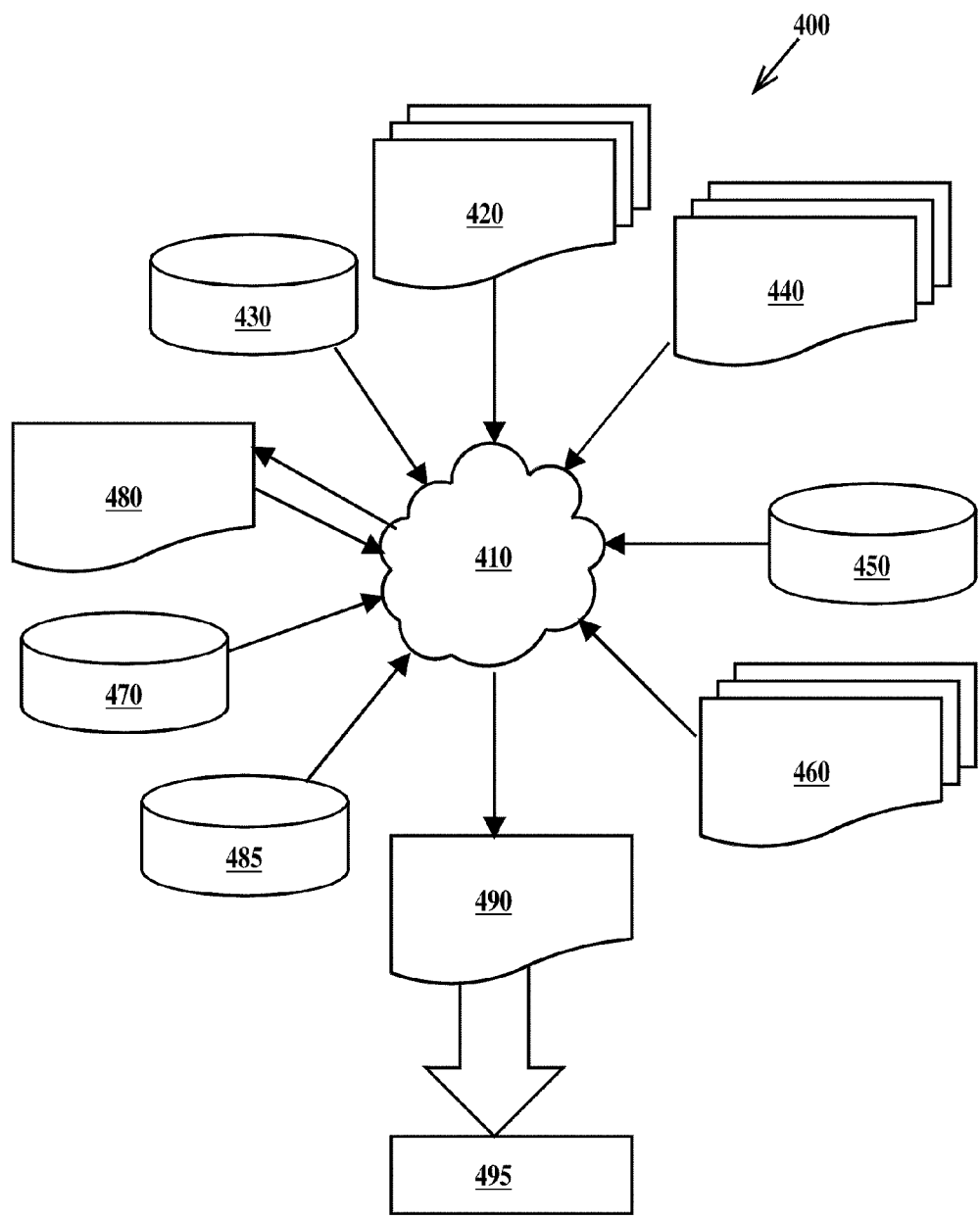
FIG. 14 shows a block diagram of an exemplary design flow 400 used for example, in semiconductor IC logic design, simulation, test, layout, and manufacture.

FIG. 14 shows a block diagram of an exemplary design flow 400 used for example, in semiconductor IC logic design, simulation, test, layout, and manufacture. Design flow 400 includes processes and mechanisms for processing design structures or devices to generate logically or otherwise functionally equivalent representations of the design structures and/or devices described above and shown in FIGS. 9A, 9B, 9C, 9D, 9E, 10A, 10B, 10C, 10D, 11, 12 and 13. The design structures processed and/or generated by design flow 400 may be encoded on machine-readable transmission or storage media to include data and/or instructions that when performed or otherwise processed on a data processing system generate a logically, structurally, mechanically, or otherwise functionally equivalent representation of hardware components, circuits, devices, or systems. Design flow 400 may vary depending on the type of representation being designed. For example, a design flow 400 for building an application specific IC (ASIC) may differ from a design flow 400 for designing a standard component or from a design flow 400 for instantiating the design into a programmable array, for example a programmable gate array (PGA) or a field programmable gate array (FPGA).

FIG. 14 illustrates multiple such design structures including an input design structure 420 that is preferably processed by a design process 410. In one embodiment, the design structure 420 comprises input design data used in a design process and comprising information describing an embodiment of the invention with respect to a CMOS imaging cell as shown in FIGS. 9A, 9B, 9C, 9D, 9E, 10A, 10B, 10C, 10D, 11, 12 and 13. The design data in the form of schematics or HDL, a hardware description language (e.g., Verilog, VHDL, C, etc.) may be embodied on one or more machine-readable media. For example, design structure 420 may be a text file, numerical data or a graphical representation of an embodiment of the invention as shown in FIGS. 9A, 9B, 9C, 9D, 9E, 10A, 10B, 10C, 10D, 11, 12 and 13. Design structure 420 may be a logical simulation design structure generated and processed by design process 410 to produce a logically equivalent functional representation of a hardware device. Design structure 420 may also or alternatively comprise data and/or program instructions that when processed by design process 410, generate a functional representation of the physical structure of a hardware device. Whether representing functional and/or structural design features, design structure 420 may be generated using electronic computer-aided design (ECAD) such as implemented by a core developer/designer. When encoded on a machine-readable data transmission, gate array, or storage medium, design structure 420 may be accessed and processed by one or more hardware and/or software modules within design process 410 to simulate or otherwise functionally represent an electronic component, circuit, electronic or logic module, apparatus, device, or system such as those shown in FIGS. 9A, 9B, 9C, 9D, 9E, 10A, 10B, 10C, 10D, 11, 12 and 13. As such, design structure 420 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware description language (HDL) design entities or other data structures conforming to and/or compatible with lower-level HDL design languages such as Verilog and VHDL, and/or higher-level design languages such as C or C++.

Design process 410 preferably employs and incorporates hardware and/or software modules for synthesizing, translating, or otherwise processing a design/simulation functional equivalent of the components, circuits, devices, or logic structures shown in FIGS. 9A, 9B, 9C, 9D, 9E, 10A, 10B, 10C, 10D, 11, 12 and 13 to generate a netlist 480 which may contain design structures such as design structure 420. Netlist 480 may comprise, for example, compiled or otherwise processed data structures representing a list of wires, discrete components, logic gates, control circuits, I/O devices, models, etc. that describes the connections to other elements and circuits in an integrated circuit design. Netlist 480 may be synthesized using an iterative process in which netlist 480 is re-synthesized one or more times depending on design specifications and parameters for the device. As with other design structure types described herein, netlist 480 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 410 may include hardware and software modules for processing a variety of input data structure types including netlist 480. Such data structure types may reside, for example, within library elements 430 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 440, characterization data 450, verification data 460, design rules 470, and test data files 485 which may include input test patterns, output test results, and other testing information. Design process 410 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 410 without deviating from the scope and spirit of the invention. Design process 410 may also include modules for performing standard circuit design processes such as timing analysis, verification, design rule checking, place and route operations, etc.

Design process 410 employs and incorporates logic and physical design tools such as HDL compilers and simulation model build tools to process design structure 420 together with some or all of the depicted supporting data structures along with any additional mechanical design or data (if applicable), to generate a output design structure 490 comprising output design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 420, design structure 490 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 9A, 9B, 9C, 9D, 9E, 10A, 10B, 10C, 10D, 11, 12 and 13. In one embodiment, design structure 490 may comprise a compiled, executable HDL simulation model that functionally simulates the devices shown in FIGS. 9A, 9B, 9C, 9D, 9E, 10A, 10B, 10C, 10D, 11, 12 and 13. Design structure 490 may also employ a data format used for the exchange of layout data of integrated circuits and/or symbolic data format (e.g. information stored in a GDSII (GDS2), GL1, OASIS, map files, or any other suitable format for storing such design data structures). Design structure 490 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 9A, 9B, 9C, 9D, 9E, 10A, 10B, 10C, 10D, 11, 12 and 13. Design structure 490 may then proceed to a stage 495 where, for example, design structure 490 proceeds to tape-out, is released to manufacturing, is released to a mask house, is sent to another design house, is sent back to the customer, etc.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A pixel sensor cell, comprising:
   a photodiode body in a first region of a semiconductor layer;
   a floating diffusion node in a second region of said semiconductor layer, a third region of said semiconductor layer between and abutting said first and second regions; and
   dielectric isolation in said semiconductor layer, said dielectric isolation surrounding said first, second and third regions, said dielectric isolation abutting said first, second and third regions of said photodiode body, said dielectric isolation not abutting said floating diffusion node, portions of said second region intervening between said dielectric isolation and said floating diffusion node; and
   a dielectric passivation layer abutting said dielectric isolation in said second region, said dielectric isolation passivation not abutting said floating diffusion node, portions of said second region intervening between said dielectric passivation layer and floating diffusion node.

2. The pixel sensor cell of claim 1, further comprising:
   a buried electron shield in said second region, said buried electron shield abutting said dielectric isolation in said second region and a bottom surface of said floating diffusion node, said buried electron shield not extending to a top surface of said semiconductor layer, portions of said second region intervening between said buried electron shield and said top surface of said semiconductor layer.

3. The pixel sensor cell of claim 2, wherein said buried electron shield extends under a bottom surface of said dielectric isolation in said second region.

4. The pixel sensor cell of claim 1, wherein said dielectric isolation passivation layer extends under a bottom surface of said dielectric isolation in said second region.

5. The pixel sensor cell of claim 1, further comprising:
   a pinning layer extending from a top surface of said semiconductor layer into said second region, said pinning layer abutting said dielectric isolation in said second region, said pinning layer not abutting said floating diffusion node, said floating diffusion node extending further into said second region than said pinning layer.

6. The pixel sensor cell of claim 1, wherein said semiconductor layer is doped a first dopant type and said photodiode body and said floating diffusion node are doped a second dopant type, said first dopant type opposite from second dopant type.

7. The pixel sensor cell of claim 1, further comprising:
   two or more of (i) a buried electron shield in said second region, said buried electron shield abutting said dielectric isolation in said second region and a bottom surface of said floating diffusion node, said buried electron shield not extending to a top surface of said semiconductor layer, portions of said second region intervening between said buried electron shield and said top surface of said semiconductor layer (ii) a dielectric isolation passivation layer abutting said dielectric isolation in said second region, said dielectric isolation passivation not abutting said floating diffusion node, said dielectric passivation not abutting said floating diffusion node, portions of said second region intervening between said dielectric passivation layer and floating diffusion node or (iii) a pinning layer extending from a top surface of said semiconductor layer into said second region, said pinning layer abutting said dielectric isolation in said second region, said pinning layer not abutting said floating diffusion node, said floating diffusion node extending further into said second region than said pinning layer.

8. The pixel sensor cell of claim 7, wherein said semiconductor layer, said electron shield, said dielectric passivation layer and said pinning layer are doped a first dopant type and said photodiode body and said floating diffusion node are doped a second dopant type, said first dopant type opposite from second dopant type.

9. A method of fabricating a pixel sensor cell, comprising:
   forming a photodiode body in a first region of a semiconductor layer;
   forming a floating diffusion node in a second region of said semiconductor layer, a third region of said semiconductor layer between and abutting said first and second regions; and
   forming dielectric isolation in said semiconductor layer, said dielectric isolation surrounding said first, second and third regions, said dielectric isolation abutting said first, second and third regions and said photodiode body, said dielectric isolation not abutting said floating diffusion node, portions of said second region intervening between said dielectric isolation and said floating diffusion node; and
   forming a dielectric passivation layer abutting said dielectric isolation in said second region, said dielectric isolation passivation not abutting said floating diffusion node, portions of said second region intervening between said dielectric passivation layer and floating diffusion node.

10. The method of claim 9, further comprising:
forming a buried electron shield in said second region, said buried electron shield abutting said dielectric isolation in said second region and a bottom surface of said floating diffusion node, said buried electron shield not extending to a top surface of said semiconductor layer, portions of said second region intervening between said buried electron shield and said top surface of said semiconductor layer.

11. The method of claim 10, wherein said buried electron shield extends under a bottom surface of said dielectric isolation in said second region.

12. The method of claim 9, wherein said dielectric isolation passivation layer extends under a bottom surface of said dielectric isolation in said second region.

13. The method of claim 9, further comprising:
forming a pinning layer extending from a top surface of said semiconductor layer into said second region, said pinning layer abutting said dielectric isolation in said second region, said pinning layer not abutting said floating diffusion node, said floating diffusion node extending further into said second region than said pinning layer.

14. The method of claim 9, wherein said semiconductor layer is doped a first dopant type and said photodiode body and said floating diffusion node are doped a second dopant type, said first dopant type opposite from second dopant type.

15. The method of claim 9, further comprising:
two or more of (i) forming a buried electron shield in said second region, said buried electron shield abutting said dielectric isolation in said second region and a bottom surface of said floating diffusion node, said buried electron shield not extending to a top surface of said semiconductor layer, portions of said second region intervening between said buried electron shield and said top surface of said semiconductor layer: (ii) forming a dielectric isolation passivation layer abutting said dielectric isolation in said second region, said dielectric isolation passivation not abutting said floating diffusion node, said dielectric isolation passivation not abutting said floating diffusion node, portions of said second region intervening between said dielectric passivation layer and floating diffusion node or (iii) forming a pinning layer extending from a top surface of said semiconductor layer into said second region, said pinning layer abutting said dielectric isolation in said second region, said pinning layer not abutting said floating diffusion node, said floating diffusion node extending further into said second region than said pinning layer.

16. The method of claim 15, wherein said semiconductor layer, said electron shield, said dielectric passivation layer and said pinning layer are doped a first dopant type and said photodiode body and said floating diffusion node are doped a second dopant type, said first dopant type opposite from second dopant type.

17. A design structure, comprising:
design data tangibly embodied in a non-transitory machine-readable medium, the design data being used for designing, manufacturing, or testing an integrated circuit, the design data
comprising information describing a pixel sensor cell~the pixel sensor cell comprising: a photodiode body in a first region of a semiconductor layer; a floating diffusion node in a second region of said semiconductor layer, a third region of said semiconductor layer between and abutting said first and second regions; and
dielectric isolation in said semiconductor layer, said dielectric isolation surrounding said first, second and third regions, said dielectric isolation abutting said first, second and third regions and said photodiode body, said dielectric isolation not abutting said floating diffusion node, portions of said second region intervening between said dielectric isolation and said floating diffusion node; and
a dielectric passivation layer abutting said dielectric isolation in said second region, said dielectric isolation passivation not abutting said floating diffusion node, portions of said second region intervening between said dielectric passivation layer and floating diffusion node.

18. The design structure of claim 17, wherein the pixel sensor cell of further includes:
a buried electron shield in said second region, said buried electron shield abutting said dielectric isolation in said second region and a bottom surface of said floating diffusion node, said buried electron shield not extending to a top surface of said semiconductor layer, portions of said second region intervening between said buried electron shield and said top surface of said semiconductor layer.

19. The design structure of claim 17, wherein the pixel sensor cell of further includes:
a pinning layer extending from a top surface of said semiconductor layer into said second region, said pinning layer abutting said dielectric isolation in said second region, said pinning layer not abutting said floating diffusion node, said floating diffusion node extending further into said second region than said pinning layer.

20. The design structure of claim 17, wherein the pixel sensor cell further includes two or more of: (i) a buried electron shield in said second region, said buried electron shield abutting said dielectric isolation in said second region and a bottom surface of said floating diffusion node, said buried electron shield not extending to a top surface of said semiconductor layer, portions of said second region intervening between said buried electron shield and said top surface of said semiconductor layer (ii) a dielectric isolation passivation layer abutting said dielectric isolation in said second region, said dielectric isolation passivation not abutting said floating diffusion node, said dielectric isolation passivation not abutting said floating diffusion node, portions of said second region intervening between said dielectric passivation layer and floating diffusion node or (iii) a pinning layer extending from a top surface of said semiconductor layer into said second region, said pinning layer abutting said dielectric isolation in said second region, said pinning layer not abutting said floating diffusion node, said floating diffusion node extending further into said second region than said pinning layer.

21. The design structure of claim 17, wherein the design structure resides on storage medium as a data format used for the exchange of layout data of integrated circuits.

22. The design structure of claim 17, wherein the design structure comprises a netlist.

23. The pixel sensor of claim 1, including:
a reset gate transistor connected to said floating diffusion node and to a source follower transistor, said source follower transistor connected to a row select transistor; and
a transfer gate connected to said floating diffusion node, to said photodiode body and to a global shutter transistor.

24. The pixel sensor of claim 1, including:
said third region of said semiconductor layer on a first side of said photodiode body and between and abutting said first and second regions, said third region being a channel region of and under a gate electrode of a transfer gate transistor;
a fourth region of said semiconductor layer abutting a second and opposite side of said photodiode body, said fourth region being a channel region of and under a gate electrode of a global shutter transistor; and
said dielectric isolation also surrounding said fourth regions and abutting opposite third and fourth sides of said photodiode body.

25. The method of claim 9, including:
forming a reset gate transistor connected to said floating diffusion node and to a source follower transistor, said source follower transistor connected to a row select transistor; and
forming a transfer gate connected to said floating diffusion node, to said photodiode body and to a global shutter transistor.

26. The method of claim 9, including:
said third region of said semiconductor layer on a first side of said photodiode body and between and abutting said first and second regions, said third region being a channel region of and under a gate electrode of a transfer gate transistor;
forming a fourth region of said semiconductor layer abutting a second and opposite side of said photodiode body, said fourth region being a channel region of and under a gate electrode of a global shutter transistor; and
said dielectric isolation also surrounding said fourth regions and abutting opposite third and fourth sides of said photodiode body.

27. The design structure of claim 17, wherein the pixel sensor cell of includes:
a reset gate transistor connected to said floating diffusion node and to a source follower transistor, said source follower transistor connected to a row select transistor; and
a transfer gate connected to said floating diffusion node, to said photodiode body and to a global shutter transistor.

28. The design structure of claim 17, wherein the pixel sensor cell of includes:
said third region of said semiconductor layer on a first side of said photodiode body and between and abutting said first and second regions, said third region being a channel region of and under a gate electrode of a transfer gate transistor;
a fourth region of said semiconductor layer abutting a second and opposite side of said photodiode body, said fourth region being a channel region of and under a gate electrode of a global shutter transistor; and
said dielectric isolation also surrounding said fourth regions and abutting opposite third and fourth sides of said photodiode body.

* * * * *